United States Patent
Rahman

(10) Patent No.: US 8,987,868 B1
(45) Date of Patent: Mar. 24, 2015

(54) METHOD AND APPARATUS FOR PROGRAMMABLE HETEROGENEOUS INTEGRATION OF STACKED SEMICONDUCTOR DIE

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 451 days.

(21) Appl. No.: 12/392,065

(22) Filed: Feb. 24, 2009

(51) Int. Cl.
*H01L 29/40* (2006.01)

(52) U.S. Cl.
USPC ........... 257/621; 257/622; 257/685; 257/698; 257/774; 257/779; 257/E23.067; 257/E23.174; 438/106; 438/109; 326/37; 326/38; 326/39; 326/50

(58) Field of Classification Search
CPC ...................... H01L 2924/14; H01L 21/76898; H01L 2225/06541; H01L 25/0652; H01L 24/81; H01L 23/49827; H01L 2924/15311; H01L 2223/6622; H01L 2224/0231
USPC ......... 257/621, 622, 685, 686, 698, 774, 777, 257/779, E23.067, E23.174; 438/106, 109; 326/37–50
See application file for complete search history.

(56) References Cited

U.S. PATENT DOCUMENTS

| | | |
|---|---|---|
| 4,698,760 A | 10/1987 | Lembach et al. |
| 5,157,618 A | 10/1992 | Ravindra et al. |
| 5,399,898 A | 3/1995 | Rostoker |
| 5,448,198 A | 9/1995 | Toyoshima et al. |
| 5,461,338 A | 10/1995 | Hirayama et al. |
| 5,487,033 A | 1/1996 | Keeney et al. |
| 5,504,440 A | 4/1996 | Sasaki |
| 5,612,636 A | 3/1997 | Ko |
| 5,654,898 A | 8/1997 | Roetcisoender et al. |
| 5,661,685 A | 8/1997 | Lee et al. |
| 5,682,062 A | 10/1997 | Gaul |
| 5,703,522 A | 12/1997 | Arimoto et al. |
| 5,742,178 A | 4/1998 | Jenkins, IV et al. |
| 5,787,011 A | 7/1998 | Ko |
| 5,808,479 A | 9/1998 | Sasaki et al. |

(Continued)

FOREIGN PATENT DOCUMENTS

| | | |
|---|---|---|
| JP | 11-122047 | 4/1999 |
| JP | 2001-015603 | 1/2001 |

(Continued)

OTHER PUBLICATIONS

U.S. Appl. No. 11/701,807, filed Feb. 1, 2007, Rahman et al.

(Continued)

*Primary Examiner* — Meiya Li
(74) *Attorney, Agent, or Firm* — Robert M. Brush; Gerald Chan; Keith Taboada

(57) ABSTRACT

Method and apparatus for programmable heterogeneous integration of stacked semiconductor die are described. In some examples, a semiconductor device includes a first integrated circuit (IC) die including through-die vias (TDVs); a second IC die vertically stacked with the first IC die, the second IC die including inter-die contacts electrically coupled to the TDVs; the first IC die including heterogeneous power supplies and a mask-programmable interconnect, the mask-programmable interconnect mask-programmed to electrically couple a plurality of the heterogeneous power supplies to the TDVs; and the second IC die including active circuitry, coupled to the inter-die contacts, configured to operate using the plurality of heterogeneous power supplies provided by the TDVs.

12 Claims, 2 Drawing Sheets

(56) References Cited

U.S. PATENT DOCUMENTS

| | | | |
|---|---|---|---|
| 5,811,985 | A | 9/1998 | Trimberger et al. |
| 5,815,004 | A | 9/1998 | Trimberger et al. |
| 5,825,707 | A | 10/1998 | Nozawa et al. |
| 5,880,598 | A | 3/1999 | Duong |
| 5,880,620 | A | 3/1999 | Gitlin et al. |
| 5,880,967 | A | 3/1999 | Jyu et al. |
| 5,892,961 | A | 4/1999 | Trimberger |
| 5,914,616 | A | 6/1999 | Young et al. |
| 5,917,709 | A | 6/1999 | Johnson et al. |
| 5,984,510 | A | 11/1999 | Guruswamy et al. |
| 5,995,379 | A | 11/1999 | Kyougoku et al. |
| 6,097,113 | A | 8/2000 | Teraoka et al. |
| 6,150,724 | A | 11/2000 | Wenzel et al. |
| 6,163,168 | A | 12/2000 | Nguyen et al. |
| 6,178,542 | B1 | 1/2001 | Dave |
| 6,269,458 | B1 | 7/2001 | Jeter et al. |
| 6,272,668 | B1 | 8/2001 | Teene |
| 6,348,813 | B1 | 2/2002 | Agrawal et al. |
| 6,362,649 | B1 | 3/2002 | McGowen |
| 6,369,630 | B1 | 4/2002 | Rockett |
| 6,448,808 | B2 | 9/2002 | Young et al. |
| 6,505,322 | B2 | 1/2003 | Yamashita et al. |
| 6,539,536 | B1 | 3/2003 | Singh et al. |
| 6,577,013 | B1 | 6/2003 | Glenn et al. |
| 6,583,645 | B1 | 6/2003 | Bennett et al. |
| 6,590,419 | B1 | 7/2003 | Betz et al. |
| 6,604,228 | B1 | 8/2003 | Patel et al. |
| 6,621,325 | B2 | 9/2003 | Gitlin et al. |
| 6,630,838 | B1 | 10/2003 | Wong |
| 6,721,924 | B2 | 4/2004 | Patra et al. |
| 6,777,978 | B2 | 8/2004 | Hart et al. |
| 6,882,045 | B2 | 4/2005 | Massingill et al. |
| 6,903,443 | B2 | 6/2005 | Farnworth et al. |
| 6,930,510 | B2 | 8/2005 | New |
| 6,950,998 | B1 | 9/2005 | Tuan |
| 7,068,072 | B2 | 6/2006 | New et al. |
| 7,089,527 | B2 | 8/2006 | Hart et al. |
| 7,138,828 | B2 | 11/2006 | New |
| 7,276,799 | B2 | 10/2007 | Lee et al. |
| 7,323,771 | B2 | 1/2008 | Fujita et al. |
| 7,337,100 | B1 | 2/2008 | Hutton et al. |
| 7,367,503 | B2 | 5/2008 | Harai et al. |
| 7,412,668 | B1 | 8/2008 | Duong |
| 7,435,910 | B2 | 10/2008 | Sakamoto et al. |
| 7,466,028 | B1 | 12/2008 | Yu et al. |
| 7,493,247 | B2 | 2/2009 | Memmi |
| 7,509,608 | B1 | 3/2009 | Duong |
| 7,518,398 | B1 | 4/2009 | Rahman et al. |
| 7,538,033 | B2 | 5/2009 | Trezza |
| 7,557,367 | B2 | 7/2009 | Rogers et al. |
| 7,605,458 | B1 | 10/2009 | Rahman et al. |
| 7,619,441 | B1 | 11/2009 | Rahman et al. |
| 7,765,686 | B2 | 8/2010 | Murakami et al. |
| 7,838,997 | B2 | 11/2010 | Trezza |
| 7,904,864 | B2 | 3/2011 | Huynh et al. |
| 8,390,035 | B2 | 3/2013 | Bemanian et al. |
| 8,692,561 | B2 | 4/2014 | Cordero et al. |
| 2001/0048319 | A1 | 12/2001 | Miyazaki et al. |
| 2002/0069396 | A1 | 6/2002 | Bhattacharya et al. |
| 2002/0139577 | A1 | 10/2002 | Miller |
| 2002/0163826 | A1 | 11/2002 | Devlin et al. |
| 2003/0066037 | A1 | 4/2003 | Patra et al. |
| 2004/0061238 | A1 | 4/2004 | Sekine |
| 2006/0113598 | A1* | 6/2006 | Chen et al. ............ 257/347 |
| 2008/0150088 | A1 | 6/2008 | Reed et al. |
| 2008/0178023 | A1 | 7/2008 | Kim et al. |
| 2009/0020855 | A1* | 1/2009 | Pyeon ............ 257/621 |
| 2009/0230552 | A1 | 9/2009 | Pendse |
| 2009/0281772 | A1 | 11/2009 | Jamann et al. |
| 2009/0315627 | A1* | 12/2009 | Bereza et al. ............ 331/2 |
| 2009/0319968 | A1 | 12/2009 | Wang et al. |
| 2009/0321947 | A1* | 12/2009 | Pratt ............ 257/777 |
| 2010/0259296 | A1 | 10/2010 | Or-Bach |
| 2010/0270597 | A1 | 10/2010 | Sproch et al. |
| 2010/0289124 | A1 | 11/2010 | Nuzzo et al. |
| 2011/0018573 | A1 | 1/2011 | Hamada et al. |
| 2011/0036396 | A1 | 2/2011 | Jayaraman et al. |
| 2011/0131427 | A1 | 6/2011 | Jorgenson et al. |
| 2011/0276321 | A1 | 11/2011 | Tuan et al. |

FOREIGN PATENT DOCUMENTS

| | | |
|---|---|---|
| JP | 2001-068606 | 3/2001 |
| JP | 11-195976 | 7/2005 |
| JP | 2005339052 | 12/2005 |
| JP | 2007053761 | 3/2007 |
| JP | 2009 237972 | 10/2009 |
| WO | WO 00/52826 A | 9/2000 |
| WO | WO 01/28097 A | 4/2001 |

OTHER PUBLICATIONS

U.S. Appl. No. 12/041,612, filed Mar. 3, 2008, Rahman et al.
U.S. Appl. No. 12/361,827, filed Jan. 29, 2009, Rahman et al.
U.S. Appl. No. 12/361,115, filed Jan. 28, 2009, Rahman.
U.S. Appl. No. 13/866,893, filed Apr. 19, 2013, Vo.
U.S. Appl. No. 12/774,110, filed May 5, 2010, Rahman.
Betz, Vaughn et al., "FPGA Routing Architecture: Segmentation and Buffering to Optimize Speed and Density," *Proc. of the 1999 ACM/SIGDA 7th International Symposium on Field Programmable Gate Arrays*, Feb. 21-23, 1999, pp. 59-68, ACM, New York, NY, USA.
Chow, C.T. et al., "Dynamic Voltage Scaling for Commercial FPGAs," *Proc. of the 2005 IEEE International Conference on Field-Programmable Technology*, Dec. 11, 2005, pp. 173-180, IEEE, Piscataway, NJ, USA.
Dobbelaere, Ivo et al., "Regenerative Feedback Repeaters for Programmable Interconnections," *IEEE Journal of Solid-State Circuits*, Nov. 1, 1995, pp. 1246-1253, vol. 30, No. 11, IEEE, Piscataway, NJ, USA.
Hutton, Micahel et al., "Interconnect Enhancements for a High-Speed PLD Architecture," *Proc. of the ACM/SIGDA International Symposium on Field Programmable Gate Arrays*, Feb. 24, 2002, pp. 1-8, ACM, New York, NY, USA.
Kuroda, Tadahiro et al., "A 0.9 V 150 MHz 10-mW 4 mm² 2-D Discrete Cosine Transform Core Processor with Variable-Threshold-Voltage Scheme," *Digest of Technical Papers of the 42nd IEEE International Solid-State Circuits Conference*, Feb. 8, 1996, pp. 166-167, 437, IEEE, Piscataway, NJ, USA.
Kuroda, Tadahiro et al., "A High-Speed Low-Power 0.3 µm CMOS Gate Array with Variable Threshold Voltage (VT) Scheme," *Proc. of the IEEE 1996 Custom Integrated Circuits Conference*, May 5, 1996, pp. 53-56, IEEE, Piscataway, NJ, USA.
Lin, Yan et al., "Circuit and Architectures for Field Programmable Gate Array with Configurable Supply Voltage," *IEEE Transactions on Very Large Scale Integration (VLSI) Systems*, Sep. 1, 2005, pp. 1035-1047, vol. 13, No. 9, IEEE, Piscataway, NJ, USA.
Nose, Koichi et al., "$V_{TH}$-hopping Scheme for 82% Power Saving in Low-Voltage Processors," *Proc. of the IEEE 2001 Custom Integrated Circuits Conference*, May 6, 2001, pp. 93-96, IEEE, Piscataway, NJ, USA.
Wang, Ping-Tsung et al., "A Hierarchical Interconnection Structure for Field-Programmable Gate Arrays," *Proc. of the Region 10 Conference on Computer, Communication, and Power Engineering*, Oct. 19, 1993, pp. 557-560, vol. 1, IEEE, Piscataway, NJ, USA.
Xilinx, Inc., *Virtex-II Platform FPGA Handbook*, UG002 (v1.0), Dec. 6, 2000, pp. 33-75, Xilinx, Inc., San Jose, California. 95124.
Nakahira H. et al., "A Lean Power Management Technique: The Lowest power consumption for the given operating speed of LSIs", Technical Report of IEICE, ICD, Integrated Circuit, Japan, the Institute of Electronics, Information and communication Engineers, Jun. 19, 1997, vol. 97, No. 110, pp. 51-58, Japan.

* cited by examiner

US 8,987,868 B1

METHOD AND APPARATUS FOR PROGRAMMABLE HETEROGENEOUS INTEGRATION OF STACKED SEMICONDUCTOR DIE

FIELD OF THE INVENTION

One or more aspects of the present invention relate generally to semiconductor devices and, more particularly, to a method and apparatus for programmable heterogeneous integration of stacked semiconductor die.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as, for example, memories, microprocessors, and digital signal processors (DSPs). The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. The FPGA may also include various dedicated logic circuits, such as, for example, digital clock managers (DCMs), input/output (I/O) transceivers, and boundary scan logic.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them. Such a stacked arrangement is referred to as a system-in-package (SIP).

In a SIP, power supplies may be provided to the "daughter" ICs stacked on a primary IC, such as an FPGA. Typically, the primary IC receives power supplies from a package substrate (also referred to as a carrier substrate). However, in most instances, a daughter IC cannot obtain power directly from the package substrate (e.g., when the daughter IC is flip-chip bonded to the primary IC). In such cases, the daughter IC can be configured to obtain its power supplies from the primary IC itself via their interconnections. However, a particular primary IC cannot meet the various power supply voltage requirements of a wide array of potential daughter ICs. In cases where the primary IC cannot meet the power supply requirements of a desired daughter IC, either the daughter IC cannot be used, or the primary IC and/or the daughter IC must be re-designed to provide/accept compatible power supplies and re-fabricated for integration in a SIP. Re-designing and re-fabricating the primary IC, daughter IC, or both can be cost prohibitive.

Accordingly, there exists a need in the art for programmable heterogeneous integration of stacked semiconductor die that overcomes the aforementioned deficiencies.

SUMMARY OF THE INVENTION

An aspect of the invention relates to a semiconductor device. In some embodiments, the semiconductor device includes a first integrated circuit (IC) die including through-die vias (TDVs); a second IC die vertically stacked with the first IC die, the second IC die including inter-die contacts electrically coupled to the TDVs; the first IC die including heterogeneous power supplies and a mask-programmable interconnect, the mask-programmable interconnect mask-programmed to electrically couple a plurality of the heterogeneous power supplies to the TDVs; and the second IC die including active circuitry, coupled to the inter-die contacts, configured to operate using the plurality of heterogeneous power supplies provided by the TDVs.

The mask-programmable interconnect includes a redistribution metal layer and a redistribution via layer. At least one of the redistribution metal layer or the redistribution via layer is mask-programmed to couple the plurality of heterogeneous power supplies to the TDVs. The first IC die includes at least one interconnect layer configured to provide the heterogeneous power supplies, and the mask-programmable interconnect is electrically coupled to the at least one interconnect layer. The mask-programmable interconnect is disposed above the at least one interconnect layer with respect to a face side of the first IC. The first IC die includes external contacts configured to provide the heterogeneous power supplies, and the mask-programmable interconnect is electrically coupled to a plurality of the external contacts. The inter-die contacts comprise micro-pads and the external contacts comprise solder bumps, and the micro-pads have a pitch less than the solder bumps. The first IC die includes active circuitry that operates using at least a portion of the heterogeneous power supplies. At least one of the plurality of heterogeneous power supplies is not used by the active circuitry of the first IC die.

An aspect of the invention relates to a method of customizing a semiconductor device. In some embodiments, the method includes: mounting a second integrated circuit (IC) die on a first IC die such that inter-die contacts on the second IC die are electrically coupled to through-die vias (TDVs) in the first IC die; identifying heterogeneous power supplies in the first IC die and a plurality of the heterogeneous power supplies configured to drive active circuitry in the second IC die; and patterning redistribution interconnect on the first IC die using at least one mask to electrically couple the plurality of heterogeneous power supplies to the TDVs.

The redistribution interconnect includes a redistribution metal layer and a redistribution via layer. The step of patterning the redistribution interconnect includes patterning at least one of the redistribution metal layer or the redistribution via layer to couple the plurality of heterogeneous power supplies to the TDVs. The step of patterning the redistribution interconnect includes electrically coupling the redistribution interconnect to at least one metal layer in the first IC die configured to provide the plurality of heterogeneous power supplies. The step of patterning the redistribution interconnect includes electrically coupling the redistribution interconnect to external contacts on the first IC die configured to provide the plurality of heterogeneous power supplies.

An aspect of the invention relates to a semiconductor device. In some embodiments, the semiconductor device includes: a first integrated circuit (IC) die having a first face side and a backside, the first IC die including layers of interconnect formed on the face side and through-die vias (TDVs) extending between the backside and the layers of interconnect; a second IC die vertically stacked with the first IC die, the second IC die including inter-die contacts on second face side electrically coupled to the TDVs at the backside of the first IC die; the first IC die including heterogeneous power supplies and a mask-programmable interconnect disposed above the layers of interconnect, the mask-programmable interconnect mask-programmed to electrically couple a plurality of the heterogeneous power supplies to the TDVs; and the second IC die including active circuitry, coupled to the inter-die contacts, configured to operate using the plurality of heterogeneous power supplies provided by the TDVs.

The mask-programmable interconnect includes a redistribution metal layer and a redistribution via layer. At least one of the redistribution metal layer or the redistribution via layer is mask-programmed to couple the plurality of heterogeneous power supplies to the TDVs. At least one of the layers of interconnect on the first IC die is configured to provide the heterogeneous power supplies, and the redistribution via layer electrically couples the redistribution metal layer to the at least one layer of interconnect. The first IC die includes external contacts configured to provide the heterogeneous power supplies, and the redistribution via layer electrically couples the redistribution metal layer to a plurality of the external contacts. The first IC die includes active circuitry that operates using at least a portion of the heterogeneous power supplies.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
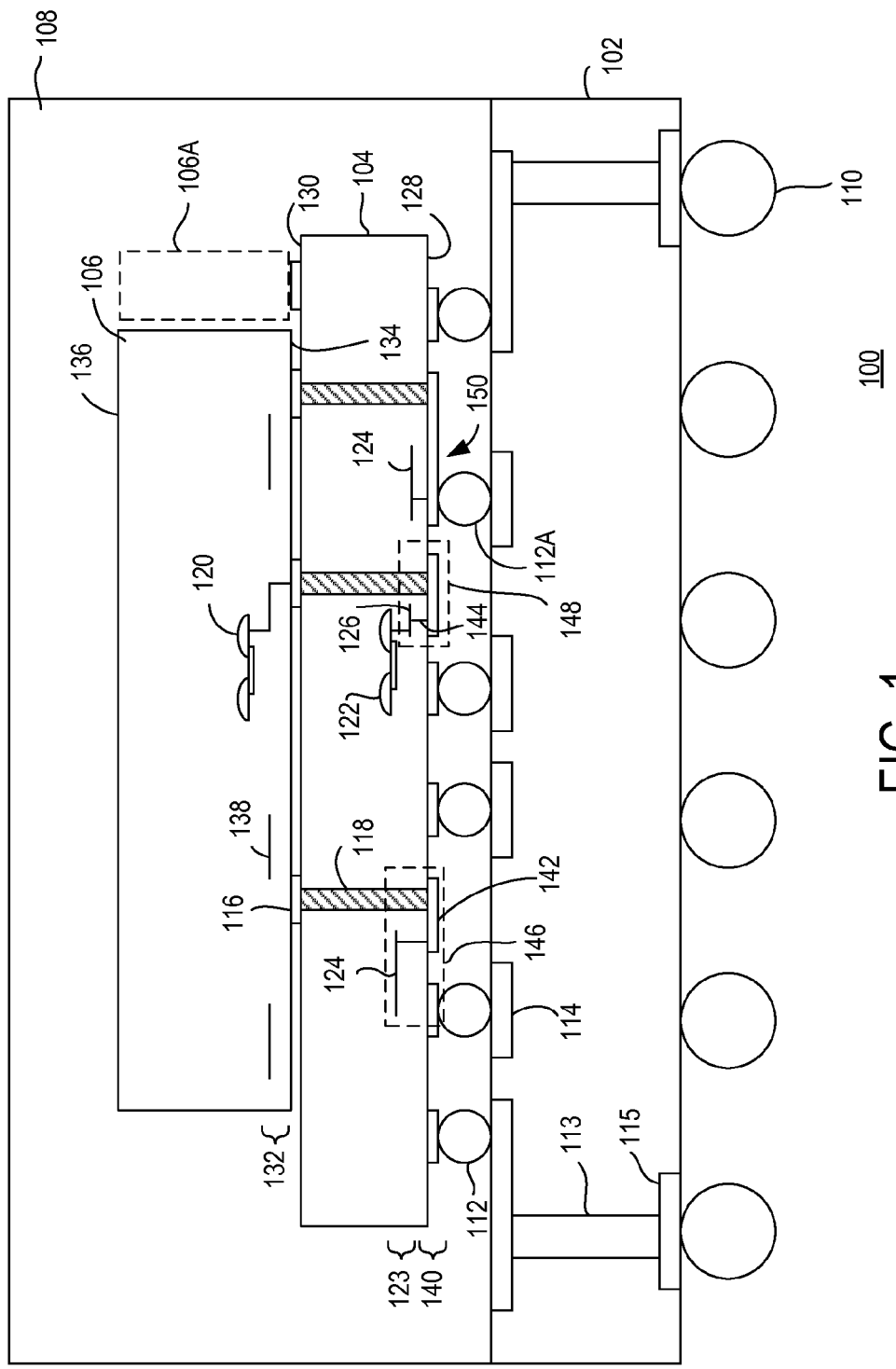
FIG. 1 is a cross-section of a semiconductor device according to some embodiments of the invention.

FIG. 1 is a cross-section of a semiconductor device 100 according to some embodiments of the invention. The semiconductor device 100 includes a carrier substrate 102, a primary integrated circuit (IC) die 104 (also referred to as a "first IC die"), a daughter IC die 106 (also referred to as a "second IC die"), and a cap 108. The carrier substrate 102 and the cap 108 provide a package for the primary IC die 104 and the daughter IC die 106. The primary IC die 104 and the daughter IC die 106 may comprise any type of ICs known in the art. In some embodiments, the primary IC die 104 comprises a field programmable gate array (FPGA) and the daughter IC die 106 comprises any type of analog, digital, or mixed signal IC, such as a random access memory (RAM). Such embodiments, however, are just some of a myriad of possible combinations of known ICs. Although the semiconductor device 100 is shown as having only a single daughter IC, it will be understood from the description below that aspects of the invention are applicable to semiconductor devices having multiple daughter ICs on a primary IC, for example the daughter IC die 106 and a daughter IC die 106a.

The carrier substrate 102 includes an array of solder balls 110 (e.g., a ball grid array (BGA)) that can be electrically and mechanically coupled to a circuit board or like type substrate (not shown) for conducting electrical signals. The carrier substrate 102 further includes conductive interconnect, which may include one or more layers of metal interconnect coupled by vias. In the present example, the carrier substrate 102 is shown as having conductive layer 114 that forms lands on a top side of the carrier substrate 102, conductive layer 115 that forms lands on a bottom side of the carrier substrate 102, and vias 113. The vias 113 electrically couple the conductive layer 115 to the conductive layer 114. The lands of the conductive layer 115 are electrically coupled to a portion of the solder balls 110.

The primary IC die 104 includes bump contacts 112 electrically coupled to the lands of the conductive layer 114 in the carrier substrate 102. The bump contacts 112 communicate electrical signals between the primary IC die 104 and the carrier substrate 102. The bump contacts 112 provide external contacts for the primary IC die 104 and thus may be referred to as "external contacts." The primary IC die 104 includes conductive interconnect 123 electrically coupled to active circuitry (symbolized as element 122). The bump contacts 112, conductive interconnect 123, and the active circuitry 122 are formed on a face side 128 of the primary IC die 104. The side opposite the face side 128 is referred to as a backside 130 of the primary IC die 104.

The conductive interconnect 123 of the primary IC die 104 may include one or more conductive layers (e.g., metal and polysilicon layers). In the present example, conductive layers 124 and 126 are shown. It is to be understood that the primary IC die 104 is merely exemplary and that a practical IC die typically includes more than two conductive layers (e.g., up to 12 conductive layers). The primary IC die 104 further includes through-die vias 118 (TDVs) extending between the backside 130 and conductive interconnect 123 on the face side 128 (e.g., vias extending through the die). The TDVs 118 are exposed at the backside 130 of the primary IC die 104.

The daughter IC die 106 includes inter-die contacts 116 electrically coupled to the exposed portions of the TDVs 118. The inter-die contacts 116 communicate electrical signals between the primary IC die 104 and the daughter IC die 106. In some embodiments, the inter-die contacts 116 may comprise micro-pads or like type contacts. The inter-die contacts 116 may have a pitch less than a pitch of the bump contacts 112. The daughter IC die 106 includes conductive interconnect 132 electrically coupled to active circuitry (symbolized as element 120). The inter-die contacts 116, the conductive interconnect 132, and the active circuitry 120 are formed on a face side 134 of the daughter IC die 106. The side opposite the face side 134 is a backside 136 of the daughter IC die 106. The conductive interconnect 132 of the daughter IC die 106 may include one or more conductive layers (e.g., metal and polysilicon layers). In the present example, a conductive layer 138 is shown. Again, It is to be understood that the daughter IC die 106 is merely exemplary and that a practical IC die typically includes more than two conductive layers (e.g., up to 12 conductive layers).

The primary IC die 104 includes heterogeneous power supplies. A power supply is a mechanism to provide a particular voltage or electrical ground. For example, the primary IC die 104 may include a core voltage, one or more 10 voltages, one or more auxiliary voltages, grounds, and the like. At least a portion of the heterogeneous power supplies drive the active circuitry 122. For example, one power supply may be the conductive layer 124, another power supply may be the conductive layer 126, and yet another power supply may be a bump contact 112A.

The primary IC die 104 includes a mask-programmable interconnect 140. The mask-programmable interconnect 140 is mask-programmed to electrically couple a plurality of the heterogeneous power supplies of the primary IC die 104 to the TDVs 118. Accordingly, the active circuitry 120 in the daughter IC die 106 is configured to receive the selected heterogeneous power supplies from the primary IC die 104 through the TDVs 118, the inter-die contacts 116, and the conductive interconnect 132. The mask-programmable interconnect 140 effectively redistributes the selected heterogeneous power supplies among the TDVs and, hence, the daughter IC die 106. As such, the mask-programmable interconnect 140 is also referred to as a redistribution interconnect. The mask-programmable interconnect 140 may be disposed above the interconnect 123 with respect to the face side 128 of the primary IC die 104. By "mask-programmable", it is meant that the interconnect 140 can be patterned using one or more customized photolithographic masks ("masks") in order to electrically couple particular ones of the heterogeneous power supplies to specific ones of the TDVs 118. The mask(s) can be custom generated in response to the particular requirements of the daughter IC die 106.

In some embodiments, the mask-programmable interconnect 140 includes a redistribution metal layer ("metal layer 142") and a redistribution via layer ("via layer 144"). The metal layer 142, the via layer 144, or both can be mask-programmable to couple the selected heterogeneous power supplies to the TDVs 118. For example, as shown in a box 146, the via layer 144 electrically couples the conductive layer 124 with the metal layer 142. In turn, the metal layer 142 is electrically coupled to a TDV 118. In this manner, the power supply implemented by the conductive layer 124 is provided to the daughter IC die 106. In another example shown in a box 148, the via layer 144 electrically couples the conductive layer 126 with the metal layer 142, which is in turn electrically coupled to a TDV 118. In another example shown by element 150, the metal layer 142 electrically couples the bump contact 112A with a TDV 118. In general, the mask-programmable interconnect 140 can be programmed to couple one or more conductive layers of the interconnect 123 and/or one or more bump contacts of the bump contacts 112 to the TDVs 118 in order to provide selected ones of the heterogeneous power supplies to the daughter IC 106.

Notably, the power supplies coupled to the daughter IC die 106 by the mask-programmable interconnect 140 may not be used by the active circuitry 122 of the primary IC die 104. That is, some of the heterogeneous power supplies of the primary IC die 104 may not be used by the active circuitry 122. For example, one type of daughter IC die may require supply voltages of 1 volt and 1.5 volts, whereas another daughter IC die may require supply voltages of 1.8 and 2.5 volts. The primary IC die 104 may use 1 volt, 1.5 volt, and 2.5 volt power supplies. In this example, the primary IC die 104 and the first daughter IC can share power supplies (e.g., the 1 and 1.5 volt supplies). The primary IC die 104 may be configured with a fourth 1.8 volt power supply that is not connected to the active circuitry 122 (since it is not needed). Thus, the appropriate power supplies can still be provided to the second daughter IC die (e.g., 1.8 and 2.5 volt supplies) despite the fact that the primary IC die 104 does not use the 1.8 volt power supply.

Accordingly, the primary IC die 104 may be configured with various heterogeneous power supplies, some or all of which may be used by the active circuitry 122. By creating customized mask(s) for the mask programmable interconnect 140, selected ones of the heterogeneous power supplies can be connected to the daughter IC die 106, where each selected power supply can be either a conductive layer in the interconnect 123 or a bump contact 112. In some embodiments, the minimum feature size of the masks for the metal layer 142 and the via layer 144 may be on the order of several microns. Thus, the monetary cost of the masks is relatively low as compared to masks for the interconnect 123 of the primary IC die 104.

Figure 2:
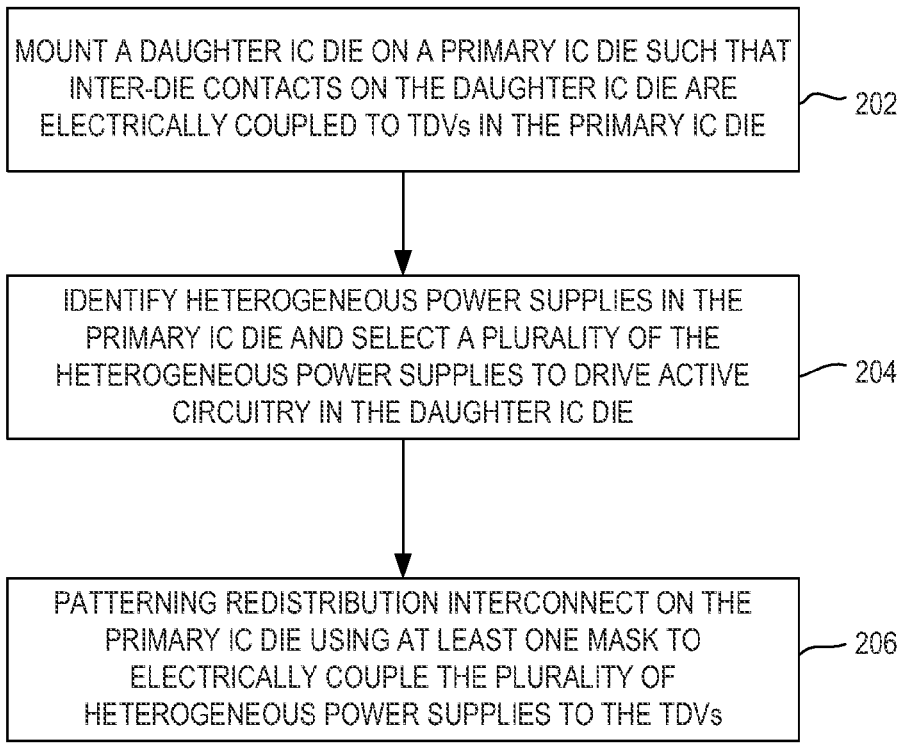
FIG. 2 is a flow diagram depicting a method of customizing a semiconductor device according to some embodiments of the invention.

FIG. 2 is a flow diagram depicting a method 200 of customizing a semiconductor device according to some embodiments of the invention. The method 200 begins at step 202, where a daughter IC die is mounted on a primary IC die such that inter-die contacts on the daughter IC die are electrically coupled to TDVs in the primary IC die. At step 204, heterogeneous power supplies are identified in the first IC and a plurality of the heterogeneous power supplies are selected to drive active circuitry in the daughter IC die. At step 206, redistribution interconnect on the primary IC die is patterned using at least one mask to electrically couple the selected heterogeneous power supplies to the TDVs in the primary IC die. In this manner, the daughter IC die is configured to receive the selected heterogeneous power supplies through mask-programming of the redistribution interconnect. Commercially available semiconductor processing equipment may be configured to perform the method 200 according to some aspects of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A semiconductor device, comprising:
   a first integrated circuit (IC) die including through-die vias (TDVs);
   a second IC die vertically stacked with the first IC die, the second IC die including inter-die contacts electrically coupled to the TDVs;
   the first IC die including first active circuitry, a mask-programmable interconnect and heterogeneous power supplies, the heterogeneous power supplies configured to provide supply voltages to a plurality of daughter IC dies, the heterogeneous power supplies including at least one via formed between the first active circuitry and the mask-programmable interconnect, the at least one via electrically directly coupled to the first active circuitry, wherein the plurality of daughter IC dies includes the second IC die, and wherein the mask-programmable interconnect electrically couples the heterogeneous power supplies to the TDVs; and
   the second IC die including second active circuitry, the second active circuitry coupled to the inter-die contacts and to at least a subset of the heterogeneous power supplies through the TDVs.

2. The semiconductor device of claim 1, wherein the mask-programmable interconnect includes a redistribution metal layer and a redistribution via layer.

3. The semiconductor device of claim 2, wherein at least one of the redistribution metal layer and the redistribution via layer electrically couples the heterogeneous power supplies to the TDVs.

4. The semiconductor device of claim 1, wherein the first IC die includes external contacts coupled to the heterogeneous power supplies, and wherein the mask-programmable interconnect is electrically coupled to the external contacts.

5. The semiconductor device of claim 4, wherein the inter-die contacts comprise micro-pads and the external contacts comprise solder bumps, and wherein the micro-pads have a first pitch less than a second pitch of the solder bumps.

6. The semiconductor device of claim 1, wherein the first active circuitry is electrically coupled to at least a portion of the heterogeneous power supplies.

7. The semiconductor device of claim 6, wherein at least one of the heterogeneous power supplies is not electrically coupled to the first active circuitry of the first IC die.

8. A semiconductor device, comprising:
- a first integrated circuit (IC) die having a first face side and a backside, the first IC die including layers of interconnect formed on the first face side and through-die vias (TDVs) extending between the backside and the first face side;
- a second IC die vertically stacked with the first IC die, the second IC die including inter-die contacts on second face side electrically coupled to the TDVs at the backside of the first IC die;
- the first IC die including first active circuitry, a mask-programmable interconnect disposed above the layers of interconnect, and heterogeneous power supplies configured to provide supply voltages to a plurality of daughter IC dies, the heterogeneous power supplies including at least one via, the at least one via directly coupled to the first active circuitry, wherein the plurality of daughter IC dies includes the second IC die, and wherein the mask-programmable interconnect electrically couples the heterogeneous power supplies to the TDVs; and
- the second IC die including second active circuitry, the second active circuitry coupled to the inter-die contacts and to at least a subset of the heterogeneous power supplies through the TDVs.

9. The semiconductor device of claim 8, wherein the mask-programmable interconnect includes a redistribution metal layer and a redistribution via layer.

10. The semiconductor device of claim 9, wherein at least one of the redistribution metal layer and the redistribution via layer electrically couples the heterogeneous power supplies to the TDVs.

11. The semiconductor device of claim 10, wherein the first IC die includes external contacts coupled to the heterogeneous power supplies, and wherein the redistribution via layer electrically couples the redistribution metal layer to the external contacts.

12. The semiconductor device of claim 8, wherein the first active circuitry is electrically coupled to at least a portion of the heterogeneous power supplies.

* * * * *